United States Patent [19]
Kobayashi et al.

[11] Patent Number: 5,767,576
[45] Date of Patent: Jun. 16, 1998

[54] SEMICONDUCTOR MODULE WITH SNAP LINE

[75] Inventors: Takatoshi Kobayashi; Toshifusa Yamada, both of Nagano, Japan

[73] Assignee: Fuji Electric Co., Ltd., Kawasaki, Japan

[21] Appl. No.: 858,452

[22] Filed: May 19, 1997

[30] Foreign Application Priority Data

May 21, 1996 [JP] Japan ................. 8-125171

[51] Int. Cl.$^6$ ................................. H01L 23/34
[52] U.S. Cl. ............ 257/701; 257/703; 257/725
[58] Field of Search ..................... 257/701, 703, 257/705, 723

[56] References Cited

U.S. PATENT DOCUMENTS 5,291,065  3/1994  Arai et al. ................. 257/723

FOREIGN PATENT DOCUMENTS

3440925 A1  5/1986  Germany ................. 257/703

Primary Examiner—Tom Thomas
Assistant Examiner—Roy Potter
Attorney, Agent, or Firm—Kanesaka & Takeuchi

[57] ABSTRACT

A semiconductor module includes a ceramic substrate for mounting plural semiconductor chips. Even if cracks and cleavages are formed in the ceramic substrate, further damages, such as lowering dielectric or insulation strength is prevented. The semiconductor module includes IGBTs arranged on one ceramic substrate soldered to a metal base plate, and the upper surface of the ceramic substrate is divided into zones. On each zone, a copper foil with one IGBT is mounted. A snap line is formed between the zones to localize the cracks and cleavages formed by bending stress to the snap line. The copper foils on the zones are connected to each other by a conductor bridge disposed over the snap line.

8 Claims, 3 Drawing Sheets

SEMICONDUCTOR MODULE WITH SNAP LINE

BACKGROUND OF THE INVENTION AND RELATED ART STATEMENT

The present invention relates to a semiconductor module for mounting a plurality of power transistor modules.

FIG. 3(a) is an exploded perspective view of a conventional semiconductor module for housing two semiconductor chips 5, i.e. IGBTs; FIG. 3(b) is a perspective view of the conventional semiconductor module assembled together; and FIG. 3(c) is an equivalent circuit of the conventional semiconductor module.

Referring now to FIGS. 3(a) and 3(b), the conventional semiconductor module includes a package having a metal base plate 1 formed of copper for heat radiation, a resin case 2 and a terminal block 3. In FIG. 3(a), two ceramic substrates 4 are positioned side by side and bonded onto the metal base plate 1. An IGBT 5 and a free-wheel diode 6 are mounted on each ceramic substrate 4. The ceramic substrate 4 is a direct bonding copper substrate including a ceramic plate made of alumina ($Al_2O_3$) or aluminum nitride (AlN), and copper foils directly bonded onto the top and bottom surfaces of the ceramic substrate. The copper foil on the top surface of the ceramic substrate is patterned corresponding to the collector, emitter and gate of the IGBT 5. The copper foil on the bottom surface of the ceramic substrate is flat so that the bottom copper foil is soldered directly to the metal base plate 1. Terminal symbols are described in FIGS. 3(b) and FIG. 3(c).

In mounting the semiconductor module on an apparatus, the metal base plate 1 is mounted on a heat sink, such as an radiator fin, to laminate thereto at an end face, and screws are inserted through holes 1a bored on both ends of the base plate 1 to connect together.

The conventional semiconductor module of FIGS. 3(a), 3(b) and FIG. 3(c) has the following problems.

In the module for mounting the semiconductor chips on a plurality of ceramic substrates, the constituent parts and assembling costs of the module increase, since plural sheets of ceramic substrates corresponding to the number of the semiconductor chips to be mounted on the module are required.

The external dimensions of the module also increase, since a predetermined spacing should be interposed between the ceramic substrates in soldering a plurality of ceramic substrates positioned side by side onto the metal base plate.

The constituent parts and the assembling steps may be decreased and the dimensions of the semiconductor module may be reduced by mounting plural semiconductor chips, as shown in FIG. 3(c), on one single sheet of a ceramic substrate. However, the ceramic substrate that mounts many semiconductor chips thereon becomes inevitably larger than the divided ceramic substrate that typically mounts one semiconductor chip thereon. Since the larger ceramic substrate is forced to bend more than the divided ceramic substrate when the thermal stress is exerted to the ceramic substrate, cracks and cleavages tend to be formed in the ceramic substrate that mounts many semiconductor chips thereon.

Especially, an aluminum nitride substrate, that exhibits excellent thermal conductivity and heat radiation, exhibits less toughness than that of the aluminum substrate. The size and application of the aluminum nitride substrate are limited, since cracks and cleavages are formed easily by the thermal stress or by the bending stress exerted by screwing the aluminum nitride substrate to the heat sink.

If cracks and cleavages are formed in the ceramic substrate under the patterned area on which the semiconductor chip or chips are mounted while the semiconductor module is in operation, the dielectric strength or insulation strength between a live or charged portion and a non-live or non-charged portion on the side of metal base plate lowers, and damages, such as ground fault, may occur.

The inventors of the present invention conducted a clamping or bending test with piano wire to study the bending strength of the ceramic substrate. In the test, piano wires of around 0.5 mm in the diameter were sandwiched between the bottom surface of the metal base plate of the semiconductor module and a surface plate imitating a radiator fin. In this condition, the package was connected by screws, and a bending load is applied to research cracks and cleavages on the ceramic substrate. The test has revealed that cracks and cleavages are formed at unspecified locations in the aluminum nitride substrate to cause insulation failure. The random cracks and cleavages lower the dielectric or insulation strength and, therefore, the reliability of the semiconductor module.

In view of the foregoing, the present invention has been made, and it is an object of the invention to provide a semiconductor module to solve the above problems, especially a structure of a ceramic substrate therefor.

It is another object of the invention to provide a semiconductor module including a ceramic substrate for mounting plural semiconductor chips connected together, wherein even if cracks and cleavages are formed in the ceramic substrate, further damages including lowering of dielectric strength or insulation failure are prevented.

SUMMARY OF THE INVENTION

According to the present invention, there is provided a semiconductor module that includes a package including a resin case, and a metal base plate; a ceramic substrate soldered to the metal base plate; a plurality of semiconductor chips connected to each other; and a first copper foil bonded to the top surface of the substrate and a second copper foil bonded to the bottom surface of the substrate. The first copper foil is patterned to have a plurality of patterns corresponding to the semiconductor chips. In the invention, the ceramic substrate is zoned or divided into a plurality of zones, each having one of the semiconductor chips mounted thereon, and one or more snap lines are formed between the zones.

The semiconductor module of the invention is constructed such that cracks and cleavages are not formed at random at unspecified locations of the ceramic substrate by bending stress, but formed to the specified one or more zones along one or more snap lines. By forming the one or more snap lines between the zones on which the semiconductor chips are mounted, no substantial insulation problems will occur in the ceramic substrate even when cracks and cleavages are formed along the one or more snap lines. Thus, the reliability of the semiconductor module of the invention, which includes a plurality of semiconductor chips on one single aluminum nitride ceramic substrate, is improved. By mounting a plurality of semiconductor chips on one single aluminum nitride ceramic substrate, the constituent parts and manufacturing steps of the semiconductor module of the invention are reduced.

The one or more snap lines may be formed on the top surface, bottom surface or both surfaces of the ceramic substrate. Advantageously, the one or more snap lines have the depth from 0.2 t to 0.3 t and the width from 0.1 t to 0.3 t, where t is the thickness of the ceramic substrate.

Additional means, that is not hazardous for localizing the cracks and cleavages formed by bending stress to the specified zone or zones along the one or more snap lines, is adopted by the present invention to secure the dielectric strength between the copper foil patterns for mounting the semiconductor chips thereon and the non-live portion on the metal base plate side.

Advantageously, one or more conductor bridges, both ends thereof being soldered to the patterns of the first copper foil, are disposed over the snap lines.

Alternatively, the first copper foil may include one or more curved jumper portions, which are continuous to the patterns of the first copper foil and are disposed over the snap lines.

Still alternatively, the first copper foil may include one or more connecting portions, which are continuous to the patterns of the first copper foil, not bonded to the ceramic substrate, and are disposed over the snap lines.

The foregoing one or more conductor bridges, curved jumper portions or connecting portions facilitate securing electrical connection between the copper foil patterns on the live portion side even when cracks and cleavages are formed. The one or more conductor bridges, curved jumper portions or connecting portions are not hazardous to localize the cracks and cleavages caused by bending stress to the specified zone or zones along the one or more snap lines and to secure sufficient creeping distance or insulation distance between the first copper foil patterns on the live or charged portion side for mounting the semiconductor chips thereon and the second copper foil bonded to the metal base plate on the non-live or non-charged portion side.

BRIEF DESCRIPTION OF THE DRAWINGS

FIG. 1($b$) is an enlarged cross sectional view of the ceramic substrate taken along line 1($b$)—1($b$) of FIG. 1($a$);

FIG. 3($b$) is a perspective view of the conventional semiconductor module; and

FIG. 3($c$) is an equivalent circuit of the conventional semiconductor module.

DETAILED DESCRIPTION OF PREFERRED EMBODIMENTS

Figure 3A:
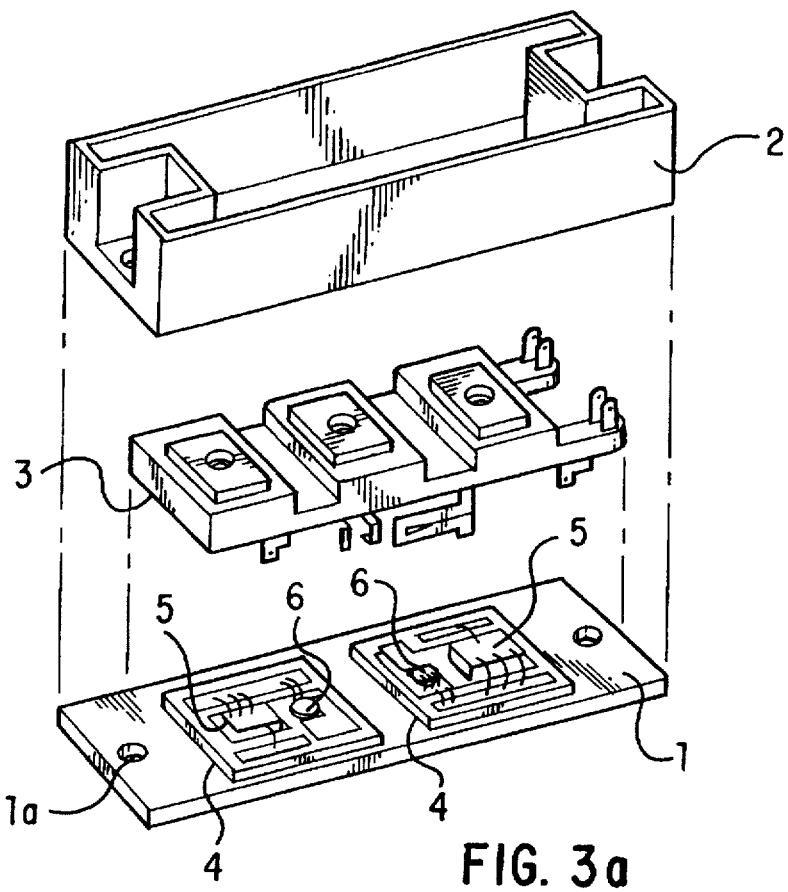
FIG. 3($a$) is an exploded perspective view of a conventional semiconductor module for housing two semiconductor chips.
Figure 3C:
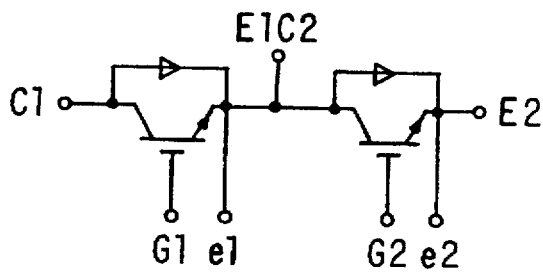
Figure 3B:
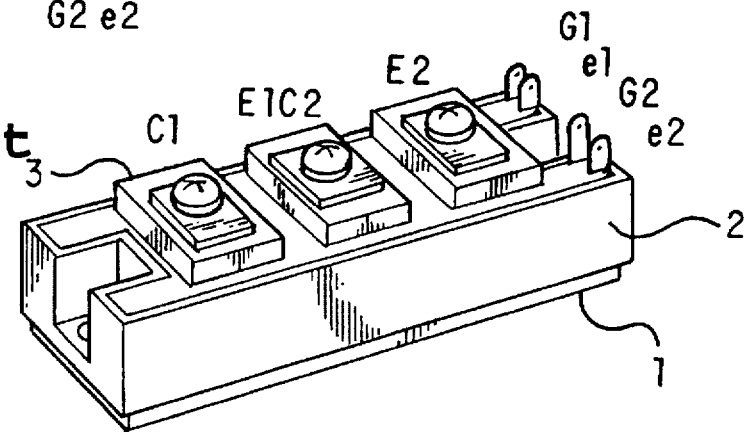
Figure 1A:
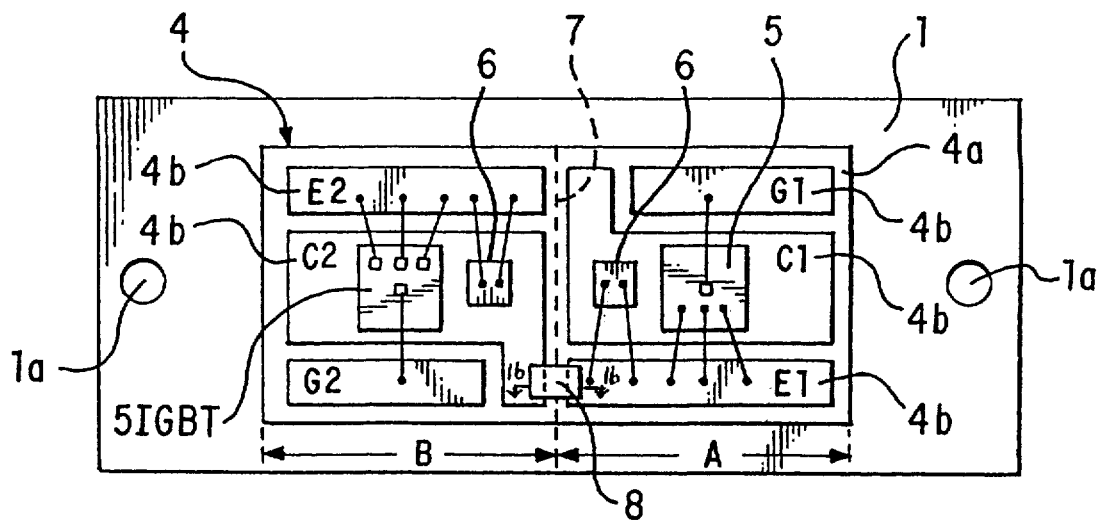
Figure 1B:
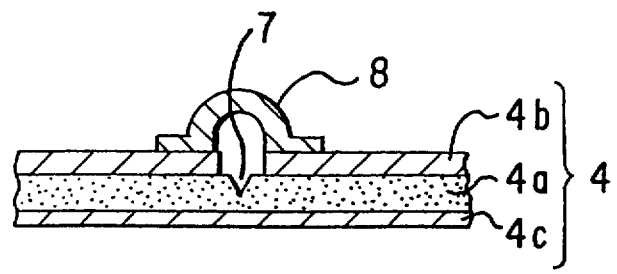

Now the present invention will be explained in detail hereinafter with accompanied drawings which illustrate the preferred embodiments of the invention. In the drawings, the same parts as those of FIGS. 3($a$), 3($b$) and 3($c$) are designated by the same reference numerals.

Referring now to FIGS. 1($a$) and 1($b$), a ceramic substrate 4 is soldered onto a metal base plate 1. One set of an IGBT 5 and a free-wheel diode 6 is mounted on the right hand side, and another set is mounted on the left hand side on the ceramic substrate 4. Two half-bridge circuits of FIG. 3($c$) are formed by connecting the right and left sets of the IGBTs 5 and free-wheel diodes 6 on the ceramic substrate 4.

The ceramic substrate 4 is a direct bonding copper substrate consisting of a ceramic plate 4$a$ formed of alumina ($Al_2O_3$) or aluminum nitride (AlN), and copper foils 4$b$ and 4$c$ directly bonded on the top and bottom surfaces of the ceramic plate. The copper foil 4$b$ bonded to the top surface of the ceramic plate 4$a$ is divided into two pattern zones A and B as shown in FIG. 1($a$). In the pattern zone A, the copper foil 4$b$ is patterned corresponding to a collector C1, emitter E1 and gate G1 of an IGBT 5. In the pattern zone B, the copper foil 4$b$ is patterned corresponding to a collector C2, emitter E2 and gate G2 of another IGBT 5. The ceramic substrate 4 is soldered to the metal base plate 1 through the copper foil 4$c$ bonded to the bottom surface of the ceramic plate 4$a$.

A snap line 7 consisting of a groove with a V-shape in a cross section is formed by scribing the surface of the ceramic plate 4$b$ along the boundary between the zones A and B. The snap line 7 is formed on the top surface of the ceramic plate 4$a$ as shown in FIG. 1($b$), but the snap line 7 may also be formed on the top and bottom surfaces of the ceramic plate 4$a$ as shown in FIG. 2($c$).

The snap line 7 is disposed along the boundary between the pattern zones to form cracks and cleavages along the boundary, which is caused by the mechanical stress when the package of the semiconductor module is screwed to the radiator fin or by the thermal stress generated by the heat cycle when the semiconductor device in the module is operating, and to prevent formation of random cracks and cleavages at unspecified locations of the ceramic substrate so that the dielectric strength or insulation failure of the ceramic substrate may not be lowered. The groove depth "a" of the snap line 7 has been found by the present inventors to be set preferably at from 0.2 t to 0.3 t and the width "b" from 0.1 t to 0.3 t with respect to the thickness "t" (e.g. 0.635 mm) of the ceramic plate 4$a$.

In the invention, even if the ceramic substrate 4 cracks along the snap line 7, the patterned copper foils 4$b$ in the zones A and B have electrical connections. In particular, the electrical connection between the copper foil pattern E1 in the zone A and the copper foil pattern C2 in the zone B is maintained to prevent deterioration of the insulation between the live or charged portion and the non-live or non-charged portion on the side of the metal base plate.

In FIG. 1($b$), an individual curved conductor bridge 8 is located over the snap line 7. Both ends of the conductor bridge 8 are soldered to the pattern zones A and B. The conductor bridge 8 connects the copper foil patterns E1 and C2 with each other.

In FIG. 2($a$), a curved jumper portion 4$d$ is formed over the snap line 7. The jumper portion 4$d$ connects the copper foil patterns E1 and C2 with each other. The jumper portion 4$d$ is formed as a part of the patterned copper foil 4$b$ at the same time when the patterned copper foil 4$b$ is formed.

In FIG. 2($b$), a connector pattern 4$e$ of the patterned copper foil 4$b$ is disposed over the snap line 7. The connector pattern 4$e$ connects the copper foil patterns E1 and C2 with each other. The connector pattern 4$e$ is not bonded to the ceramic plate 4$a$ but curved so as to float above the surface of the ceramic plate 4$a$.

By forming a pattern connecting portion disposed over the snap line 7 without bonding to the substrate, the ceramic substrate 4 cracks or cleaves, as intended, along the snap line 7 when bending stress is exerted to the ceramic substrate 4. Even if the ceramic substrate 4 is cracked or cleaved, sufficient creeping or insulation distance is maintained between the patterned copper foil 4$b$ on the live portion side and the copper foil 4c soldered to the metal base plate 1 on the non-live portion side, and the dielectric strength or insulation strength of the ceramic substrate is prevented from lowering.

The present invention is not limited to the power module for mounting two IGBTs and free-wheel diodes on one ceramic substrate. It will be obvious to those skilled in the art that the present invention is applicable to the power module that mounts more than two, e.g. four, six and so on, IGBTs and free-wheel diodes on one ceramic substrate.

According to the present invention, the constituent parts, manufacturing steps and dimensions of the semiconductor module are reduced by mounting a plurality of semiconductor chips on one single ceramic substrate, and the dielectric strength of the ceramic substrate is prevented from lowering by forming a snap line or snap lines on the ceramic substrate outside the patterned cooper foil zones where the semiconductor chips are mounted so as to prevent cracks and cleavages from being randomly formed at unspecified locations of the ceramic substrate. The cracks and cleavages, caused by bending stress and thermal stress exerted to the ceramic substrate during fixing the semiconductor module to the radiator fin, are intentionally localized to the snap line or snap lines and are prevented from being randomly formed at unspecified locations of the ceramic substrate. Thus, a wide application of the aluminum nitride substrate that exhibits excellent heat radiation but not sufficient toughness is facilitated, and the reliability of the semiconductor modules which adopt the aluminum nitride substrate is improved.

What is claimed is:

1. A semiconductor module comprising:

a metal base plate, a ceramic substrate having top and bottom surfaces and being divided into a plurality of zones, a plurality of semiconductor chips to be mounted on the ceramic substrate and connected to each other, a first copper foil bonded to the top surface of the ceramic substrate divided into the zones and patterned to have a plurality of patterns corresponding to the plurality of semiconductor chips so that the semiconductor chips are bonded to the patterns, a second copper foil bonded to the bottom surface of the ceramic substrate and soldered to an upper surface of the metal base plate, and at least one snap line formed between the zones so that when a stress is applied to the ceramic substrate, the ceramic substrate is divided along the snap line.

2. A semiconductor module according to claim 1, wherein said at least one snap line is formed on at least one of the top and bottom surfaces of the ceramic substrate.

3. A semiconductor module according to claim 1, wherein said at least one snap line has a depth from 0.2 t to 0.3 t and a width from 0.1 t to 0.3 t, said t being a thickness of the ceramic substrate.

4. A semiconductor module according to claim 1, wherein said ceramic substrate is made of aluminum nitride.

5. A semiconductor module according to claim 1, further comprising at least one conductor bridge disposed over the at least one snap line, said conductor bridge having two ends soldered to said patterns of said first copper foil.

6. A semiconductor module according to claim 1, wherein said first copper foil includes at least one curved jumper portion, said jumper portion being continuous to the patterns and disposed over the at least one snap line.

7. A semiconductor module according to claim 1, wherein said first copper foil comprises at least one connecting portion disposed over the at least one snap line, said at least one connecting portion being continuous to the patterns of the first copper foil without bonding to the ceramic substrate.

8. A semiconductor module according to claim 1, further comprising a resin case for receiving the base plate therein to form a package.

* * * * *

UNITED STATES PATENT AND TRADEMARK OFFICE
CERTIFICATE OF CORRECTION

Figure 1A:
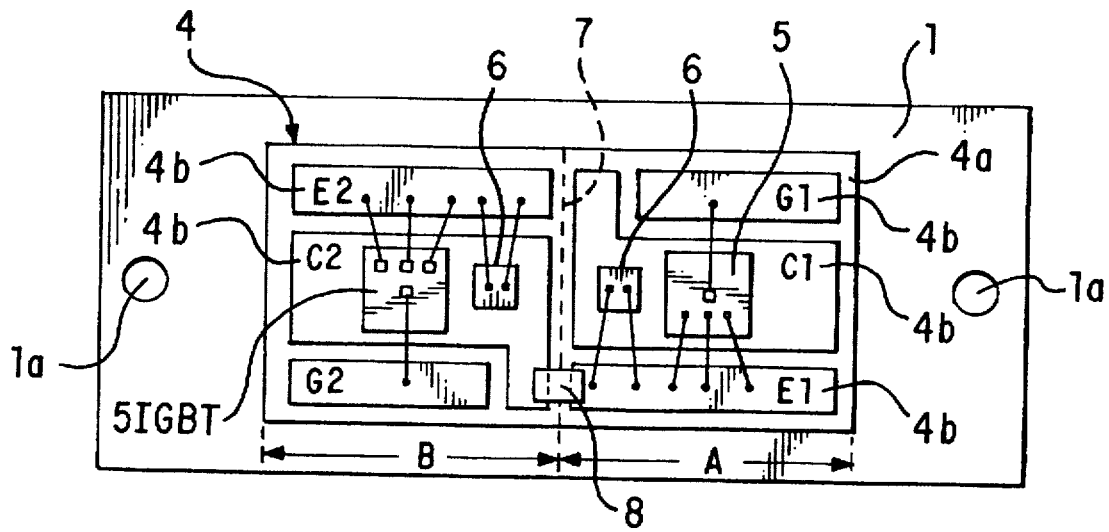
FIG. 1($a$) is a top plan view of an embodiment of a semiconductor module according to the invention.
Figure 1B:
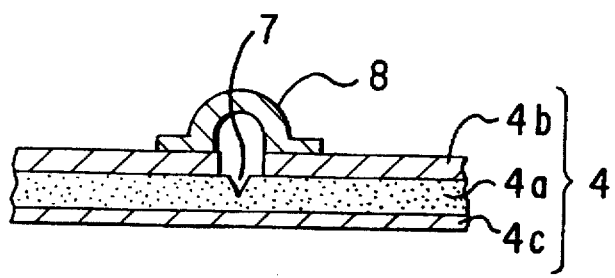
Figure 2A:
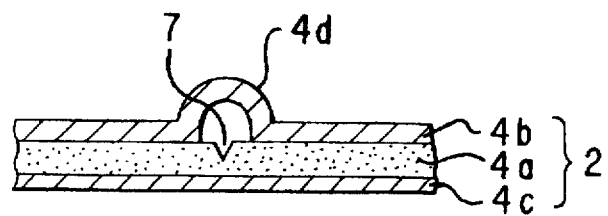
FIGS. 2($a$)—2($c$) are cross sectional views, similar to FIG. 1($b$), of different ceramic substrates.
Figure 2B:
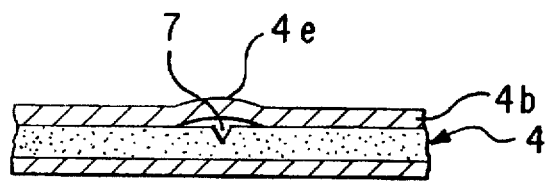
Figure 2C:
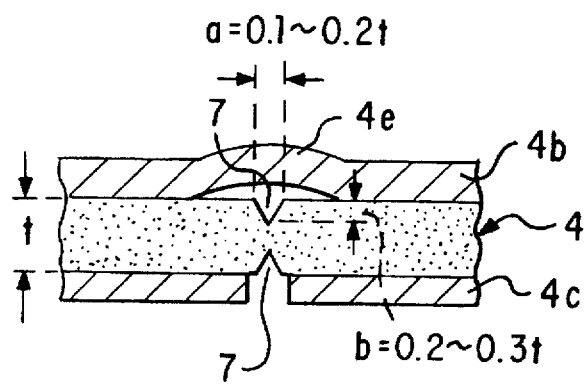

PATENT NO. : 5,767,576
DATED : June 16, 1998
INVENTOR(S) : Takatoshi Kobayashi and Toshifusa Yamada It is certified that error appears in the above-indentified patent and that said Letters Patent is hereby corrected as shown below:

On the title page, item [57] Abstract, line 5, change "is" to --are--;

In column 4, line 31, change "depth "a"" to --depth "b"--;
line 33, change "width "b"" to --width "a"--; and In Fig. 1a, add numerals --1b, 1b-- and their lead lines, as shown in red in the attached copy thereof.

Signed and Sealed this

Sixth Day of October, 1998

*Attest:*

BRUCE LEHMAN

*Attesting Officer*    Commissioner of Patents and Trademarks